(12) United States Patent
Yoshida et al.

(10) Patent No.: US 7,723,752 B2
(45) Date of Patent: May 25, 2010

(54) NITRIDE SEMICONDUCTOR HETEROJUNCTION FIELD EFFECT TRANSISTOR

(75) Inventors: Seikoh Yoshida, Tokyo (JP); Fumio Hasegawa, 8-13-32, Tsukimino, Yamato-shi, Kanagawa 242-0002 (JP)

(73) Assignees: The Furukawa Electric Co., Ltd., Tokyo (JP); Fumio Hasegawa, Yamato-shi (JP)

( * ) Notice: Subject to any disclaimer, the term of this patent is extended or adjusted under 35 U.S.C. 154(b) by 52 days.

(21) Appl. No.: 11/941,584

(22) Filed: Nov. 16, 2007

(65) Prior Publication Data
US 2008/0135880 A1 Jun. 12, 2008

(30) Foreign Application Priority Data
Nov. 17, 2006 (JP) ............................. 2006-311782

(51) Int. Cl.
*H01L 29/778* (2006.01)
(52) U.S. Cl. ............................. 257/194; 257/E29.246
(58) Field of Classification Search ................. 257/194, 257/E29.246; 438/159
See application file for complete search history.

(56) References Cited

U.S. PATENT DOCUMENTS 6,768,146 B2 7/2004 Yoshida

2007/0026587 A1* 2/2007 Briere .......................... 438/159
2008/0006846 A1 1/2008 Ikeda et al.
2008/0087917 A1* 4/2008 Briere .......................... 257/194

OTHER PUBLICATIONS

M. Asif Khan, et al. "Enhancement and depletion mode GaN/AlGaN heterostructure field effect transistors" American Institute of Physics Applied Physics Letters, vol. 68, No. 4, Jan. 22, 1996, pp. 514-516.
Yong Cai, et al. "High-Performance Enhancement-Mode AlGaN/GaN HEMTs Using Fluoride-Based Plasma Treatment" IEEE Electron Device Letters, vol. 26, No. 7, Jul. 2005, pp. 435-437.

* cited by examiner

*Primary Examiner*—Thomas L Dickey
*Assistant Examiner*—Fazli Erdem
(74) *Attorney, Agent, or Firm*—Oblon, Spivak, McClelland, Maier & Neustadt, L.L.P.

(57) ABSTRACT

In the nitride semiconductor heterojunction field effect transistor of the present invention, the floating gate layer (32), as the third layer, is formed between the control gate electrode (34) and the AlGaN layer (11), and the potential for the electrons in the AlGaN layer (11), which is substantially neighboring the floating gate layer (32), is able to be substantially high, and then the channel is able to be depleted. Hence, no current can be flowed through the channel (no drain current) at the time of no gate voltage, as so-called stable normally-off operation can be obtained.

8 Claims, 6 Drawing Sheets

NITRIDE SEMICONDUCTOR HETEROJUNCTION FIELD EFFECT TRANSISTOR

BACKGROUND OF THE INVENTION

1. Technical Field

The present invention relates to a nitride semiconductor device, and more specifically to a nitride semiconductor heterojunction field effect transistor (FET), in which drain current is zero when gate voltage is not applied, as it is called a normally-off type.

2. Related Arts

A nitride semiconductor, such as GaN, AlGaN, InGaN, and the like, has greater band gap energy than the conventional semiconductors, such as Si, GaAs, and the like. Therefore, it is excellent as a semiconductor for high temperature or high breakdown voltage devices. In particular, using materials of these nitride semiconductors (GaN semiconductors), different from other wide band gap semiconductors, such as SiC or the like, it becomes possible to form a heterojunction such as AlGaN/GaN or the like. Therefore, a nitride semiconductor heterojunction field effect transistor (a heterojunction FET: HFET), or a high electron mobility transistor (HEMT) as another name, has been actively developed.

However, in an AlGaN/GaN heterojunction interface, due to a spontaneous polarization and a piezoelectric effect (piezo effect), there occurs positive electric charges at the AlGaN side. As a result, negative electric charges (electrons) are accumulated at the GaN side. As the accumulated electrons, without any doping for the AlGaN, forms a high-density two-dimensional electron gas, a resistance of a channel, that is to say an on-resistance of the HFET, becomes drastically smaller than the on-resistance of an AlGaAs/GaAs HFET.

Meanwhile, in regular devices used for power controlling, such as an inverter, a converter, and the like, a normally-off type FET, in which drain current is zero when a gate voltage is not applied, is used. However, in an AlGaN/GaN HFET, due to a spontaneous polarization and a piezoelectric effect, it is difficult to make the two-dimensional electron gas be zero, when gate voltage is not applied.

Regarding the AlGaN/GaN HFET, for obtaining a normally-off state (an enhancement mode), there is reported a method to reduce the polarization affect by forming the AlGaN layer thinner, such as disclosed in a document 1 (M. A. Khan et al., Applied Physics Letters, vol. 68, No. 4, January 1996, pp. 514-516). Moreover, for obtaining the normally-off type FET, there is reported a method to incorporate $F^-$ ions into the AlGaN layer by exposing a sample substrate in a $CF_4$ plasma, and then to charge the AlGaN layer negative, such as disclosed in a document 2 (Yong Cai et al., IEEE Electron Device Letters, vol. 26, No. 7, JULY 2005, pp. 435-437).

In the former method disclosed in the above mentioned document 1, it is difficult to fabricate FETs with a complete normally-off state. Moreover, in this method, it is difficult to obtain a sufficient channel current, because a gate forward current is flowed under applying a positive bias onto the gate. Meanwhile, there is a method to suppress the gate forward current by adding a thin insulator of such as $Al_2O_3$ or the like onto the AlGaN. However, in the method, it is difficult to reduce an interface state of the $Al_2O_3$/AlGaN. Hence, electrons are trapped at the interface, and then channel charges are not able to be increased.

In the latter method disclosed in the above mentioned document 2, due to the $CF_4$ plasma, the AlGaN layer is etched by the plasma, or it is damaged by the plasma. Hence, a controllability as a device becomes worse. For instance, it is difficult to control a threshold voltage in accurate, so as to make the drain current be zero, even when some amount of positive voltage is applied onto the gate.

In a non-volatile memory device using a silicon metal oxide semiconductor field effect transistor (Si-MOSFET), a polysilicon is deposited between a gate and an oxide film layer. And then by thermal oxidizing it, a floating gate is formed. Moreover, using a tunneling effect of the oxide layer, electrons are incorporated into or output from the floating gate, and then the threshold voltage is able to be controlled. Thus, zero, one, on, and off of the memory device is able to be identified.

BRIEF SUMMARY OF THE INVENTION

Here, the present invention is presented with having regard to the above mentioned conventional problems. The present invention has an object to provide a nitride semiconductor heterojunction field effect transistor, of which a normally-off operation is able to be obtained, a sufficient channel current is able to be obtained, and a threshold voltage is able to be easily controlled.

A nitride semiconductor heterojunction field effect transistor according to a first aspect of the present invention comprises: a substrate; a first nitride semiconductor layer formed on the substrate; a second nitride semiconductor layer formed on the first nitride layer, which forms a heterojunction with the first nitride semiconductor layer, and forms a channel at an interface of the heterojunction; a source electrode, a drain electrode, a control gate electrode; and a dielectric layer, which is formed between the control gate electrode and the second nitride semiconductor layer, and which is negatively charged.

According to the aspect, the dielectric layer is formed between the control gate electrode and the second nitride semiconductor layer. Therefore, a potential for electrons in the second nitride semiconductor layer neighboring the dielectric layer is able to be substantially high, and then a channel is able to be depleted. Thus, when gate voltage is not applied, no current is flowed through the channel (a drain current is zero). That is to say, a stable normally-off operation is able to be obtained, and then a normally-off type nitride semiconductor heterojunction field effect transistor is able to be obtained.

Moreover, by pre-giving the negative charge to the dielectric layer, a threshold voltage of the nitride semiconductor heterojunction field effect transistor is able to be a required positive voltage. Moreover, by applying a positive bias onto the control gate electrode, a gate current is suppressed, and then a sufficiently large amount of a drain current density (a channel current) is able to be obtained. Furthermore, by adjusting the negative charge amount giving to the dielectric layer, even when some amount of the positive voltage is applied onto the control gate electrode, no current is flowed through the channel, and the threshold voltage is able to be freely controlled. Therefore, the control of the threshold voltage becomes to be simplified.

In the nitride semiconductor heterojunction field effect transistor according to a second aspect of the present invention, the dielectric layer comprises a conductive layer which is negatively charged by electrons, and the conductive layer is covered by an insulator layer.

According to the aspect, by trapping electrons in the conductive layer which is negatively charged, as the dielectric layer, a potential for electrons in the second nitride semiconductor layer substantially neighboring the conductive layer is able to be high, and then a channel is able to be depleted. Thus, when a gate voltage is zero, no current is flowed through the channel. That is to say, a stable normally-off operation is able to be obtained.

In a nitride semiconductor heterojunction field effect transistor according to a third aspect of the present invention, the dielectric layer comprises a polysilicon.

According to the aspect, as well as the case of the non-volatile memory device using Si-MOSFET, first of all, the polysilicon is so stable even at a high temperature that the reliability becomes sufficiently high. Moreover, the polysilicon is oxidized to be a high quality quartz ($SiO_2$). Thus, a probability, which the charge accumulated in the polysilicon is lost as a leak current, is able to be decreased.

In a nitride semiconductor heterojunction field effect transistor according to a fourth aspect of the present invention, the dielectric layer comprises a high-melting metal, such as molybdenum (Mo) or the like.

According to the aspect, the high-melting metal, such as (Mo) or the like, has a high melting point as well as the polysilicon. Hence, any reaction with other materials is suppressed, and then it is able to endure in a high annealing temperature, and in a high operating temperature. Therefore, a high reliability is able to be obtained. Moreover, comparing to the polysilicon, processes such as chemical etching or the like are simplified, and then it becomes easily manufactured.

In a nitride semiconductor heterojunction field effect transistor according to a fifth aspect of the present invention, the insulator layer covering the dielectric layer comprises a first insulator layer and a second insulator layer; the first insulator layer contacts with the second nitride semiconductor layer, and the second insulator layer is disposed between the dielectric layer and the control gate electrode.

According to the aspect, for the first insulator layer contacting with the second nitride semiconductor layer (for instance, AlGaN), insulator films, such as a silicon nitride film, an aluminum oxide ($Al_2O_3$) film, and the like, in which atomic elements are similar to that in the AlGaN, are used as the layer. And then an interface state at the interface with the AlGaN is able to be reduced. Moreover, for the second insulator layer which exists between the dielectric layer and the control gate electrode, for instance, a silicon dioxide ($SiO_2$) film or the like, which has a wide band gap and a high insulation performance as the insulator layer, is able to be used. And then an attenuation of the charge accumulated in the dielectric layer is able to be suppressed.

In a nitride semiconductor heterojunction field effect transistor according to a sixth aspect of the present invention, the first insulator layer contacting with the second nitride semiconductor layer is formed of silicon nitrides.

According to the aspect, using the silicon nitrides for the first insulator layer contacting with the second nitride semiconductor layer, an interface state at the interface with the second nitride semiconductor layer (for instance, an AlGaN layer) decreases. Moreover, a fluctuation of a current-voltage characteristic (decreasing of a drain current) at the time of applying a high drain bias voltage, as it is called a current collapse, is able to be controlled.

In a nitride semiconductor heterojunction field effect transistor according to a seventh aspect of the present invention, the dielectric layer comprises an insulator layer including negative ions.

According to the aspect, by trapping negative ions in the insulator layer, as the dielectric layer, a potential for electrons in the second nitride semiconductor layer substantially neighboring the insulator layer is able to be high, and then a channel is able to be depleted. Thus, at the time of a gate voltage is zero, no current is flowed through the channel. That is to say, a stable normally-off operation is able to be obtained. Moreover, by adjusting the amount of the negative ions giving to the insulator layer negatively charged, even when some amount of the positive voltage is applied onto the control gate electrode, without any current is flowed through the channel, the threshold voltage is able to be freely controlled. Therefore a nitride semiconductor heterojunction field effect transistor, in which the threshold voltage is positive, that is to say a normally-off type, is able to be obtained.

In a nitride semiconductor heterojunction field effect transistor according to an eighth aspect of the present invention, the negative ions are chlorine ions ($Cl^-$).

According to the aspect, the chlorine ion $Cl^-$, similar to such as $F^-$, $Br^-$, and the like, belongs to group XVII. Thus, it is one of the elements which is the most easily ionized to be negative. Moreover, it belongs to the similar period to silicon in particular, and it has an atomic radius which is slightly larger than silicon. Therefore, it is able to exist in such as a silicon nitride film, a silicon oxide film, and the like, more stably and as a proper amount, comparing to other elements of group XVII.

In a nitride semiconductor heterojunction field effect transistor according to a ninth aspect of the present invention, the insulator layer including the negative ions is formed of silicon nitrides.

According to the aspect, using the silicon nitrides for the insulator layer including the negative ions, the nitrogen is the element similar to that in the second nitride semiconductor layer (an AlGaN layer for instance). Hence, it becomes one of the insulator layers which have the least interface state density at the interface with the second nitride semiconductor layer. Therefore, a fluctuation of a current-voltage characteristic (decreasing of a drain current) at the time of applying a high drain bias voltage, as it is called a current collapse, is able to be suppressed.

BRIEF DESCRIPTION OF THE DRAWINGS

FIG. 2 (b) is a space charge distribution diagram of the AlGaN/GaN HFET.

DETAILED DESCRIPTION OF THE INVENTION

Embodiments of the present invention will be described below. Each embodiment of the present invention will be described, based on the drawings. In each embodiment described below, for an example of a nitride semiconductor heterojunction field effect transistor having a channel at a heterojunction interface in the nitride semiconductor, an AlGaN/GaN heterojunction field effect transistor (a heterojunction FET: HFET) is described.

Here, in the below description, the AlGaN/GaN heterojunction field effect transistor is described as AlGaN/GaN HFET. Moreover, in the description of each embodiment, for a similar part, using the similar symbol, duplicated description is omitted.

THE FIRST EMBODIMENT

Figure 1:
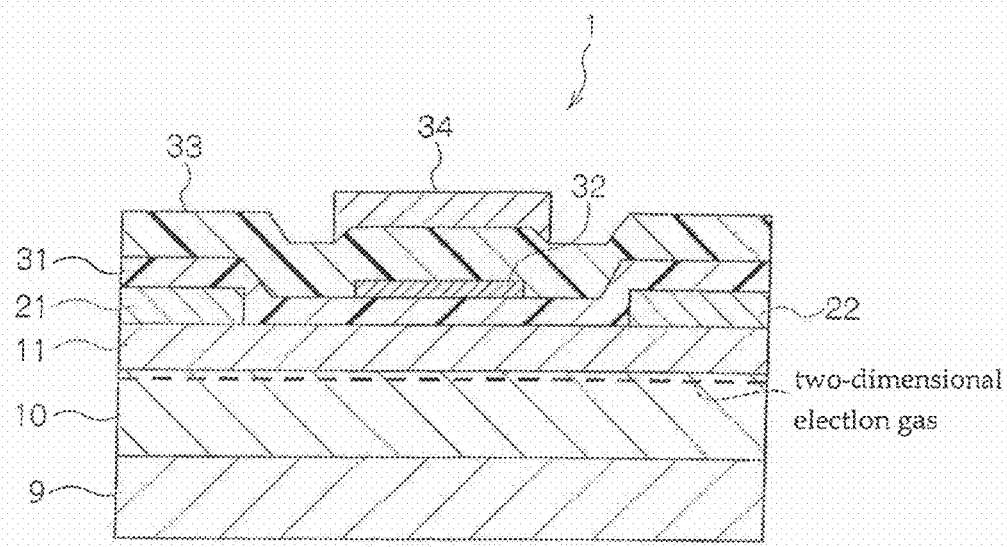
FIG. 1 is a cross sectional view showing a schematic structure according to the first embodiment of the present invention.

FIG. 1 shows a schematic structure of an AlGaN/GaN HFET (1) regarding the first embodiment. The AlGaN/GaN HFET (1) comprises a sapphire substrate (9), a GaN layer (10) formed on the sapphire substrate (9), an AlGaN layer (11) formed on the GaN layer (10), a source electrode (21), and a drain electrode (22). Moreover, there is provided a silicon nitride ($SiN_x$) film (31) on an active area between the source electrode (21) and the drain electrode (22), using a catalytic chemical vapor deposition (a cat CVD) method.

In the AlGaN/GaN HFET (1), a heterojunction interface is formed by the AlGaN layer (11) having a wide band gap and the GaN layer (10) having a narrower band gap than that of the AlGaN layer (11).

On the silicon nitride film layer (31), there is provided a floating gate layer (32) at an area inferior to a control gate electrode (34). Moreover, the floating gate layer (32) is, as an example for the embodiment, formed using a low resistance polysilicon. Furthermore, on the floating gate layer (32), there is provided an insulator layer (33) of silicon dioxide ($SiO_2$) using the CVD method, is formed, thereby the floating gate layer (32) is insulated.

The floating gate layer (32) is a third layer which is provided between the control gate electrode (34) and the AlGaN layer (11) as the nitride semiconductor, and is negatively charged. The floating gate layer (32) corresponds to a layer, which is formed between the control gate electrode and the second nitride semiconductor layer, and which is negatively charged. The floating gate layer (32) as the third layer (dielectric layer) comprises a conductive layer which is negatively charged by electrons. Moreover, as the floating gate layer (32) is covered by the silicon nitride film layer (31), the insulator layer (33) of silicon oxide, and then the electrons are trapped in the floating gate layer (32). Moreover, by pre-giving a negative charge of a proper amount of electrons into the floating gate layer (32), using such as an electron beam or the like, a threshold voltage ($V_{th}$) of the AlGaN/GaN HFET (1) is able to be controlled as a required value. Furthermore, the control gate electrode (34) is formed on the insulator layer (33) of silicon oxide, at an upper area of the floating gate layer (32) thereon.

According to the first embodiment having the above mentioned structures, the following functions and advantages are obtained.

According to the embodiment, the floating gate layer (32), as the third layer, is provided between the control gate electrode (34) and the AlGaN layer (11). Therefore, the potential for the electrons in the AlGaN layer (11) substantially neighboring the floating gate layer (32) is able to be substantially high, and then the channel able to be depleted. Thus, when the gate voltage is zero, no current is flowed through the channel (no drain current). That is to say, the stable normally-off operation is able to be obtained.

Moreover, into the floating gate layer (32), by pre-giving the negative charge of the electrons using the electron beam, the threshold vintage ($V_{th}$) of the AlGaN/GaN HFET (1) is able to be controlled as the required positive voltage.

Moreover, by applying the positive bias onto the control gate electrode (34), the gate current is controlled and then the sufficiently large amount of the drain current density is able to be obtained.

Furthermore, by adjusting the negative charge amount giving to the floating gate layer (32), even when some amount of the positive voltage is applied onto the control gate electrode (34), no current is flowed through the channel (drain current is zero), the threshold voltage ($V_{th}$) is able to be freely controlled. Thus, the control of the $V_{th}$ becomes to be simplified.

According to the embodiment, the floating gate layer (32), as the third layer (dielectric layer), comprises a conductive layer which is negatively charged by electrons. Moreover, the floating gate layer (32) is covered by the silicon nitride film layer (31) and the insulator layer (33) of silicon oxide, and then the electrons are trapped in the floating gate layer (32). Therefore, the potential for the electrons in the nitride semiconductor layer substantially neighboring the floating gate layer (32) is able to be high, and then the channel is able to be depleted. Thus, when the gate voltage is zero, no current is flowed through the channel. That is to say, the stable normally-off operation is able to be obtained.

The operation of the AlGaN/GaN HFET (1) according to the first embodiment which brings the above mentioned functions and advantages, with comparing to each operation of the above mentioned document 1 and 2, is described below. Here, for easy understanding, regarding the description of the document 1 and 2, for a part similar to that of the first embodiment, the similar symbol is used.

Figure 2:
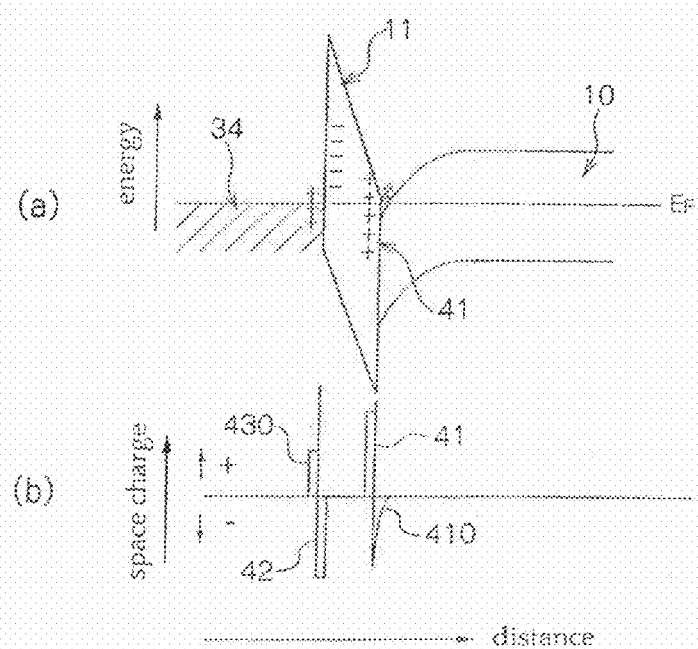
FIG. 2 (a) is an energy band diagram of an ordinary AlGaN/GaN HFET.

In the ordinary AlGaN/GaN HFET, due to the spontaneous polarization and the piezoelectric effect, as shown in the energy band diagram of FIG. 2 (a) and the space charge distribution diagram of FIG. 2 (b), in the metal (the control gate electrode)/AlGaN/GaN hetero structure, the AlGaN layer (11) at the GaN layer (10) side becomes positively charged, and at the control gate electrode (34) side, it becomes negatively charged. Here, the sum of the space charge in the system total is assumed to be zero. Hence, corresponding to the charges at the both sides of the AlGaN layer (11), at the GaN layer (10) side which has smaller band gap than that of AlGaN layer (11), a negative space charge (410) is appeared as the two-dimensional electron gas. Moreover, at the control gate electrode (34) side, a positive charge (430) is appeared. That is to say, at the GaN layer (10) side which has smaller band gap than that of AlGaN layer (11), the negative charge (410) is always induced, and then it becomes channel electrons (the two-dimensional electron gas). As a result, even if the gate voltage is zero, the channel current (drain current) is flowed.

Figure 3:
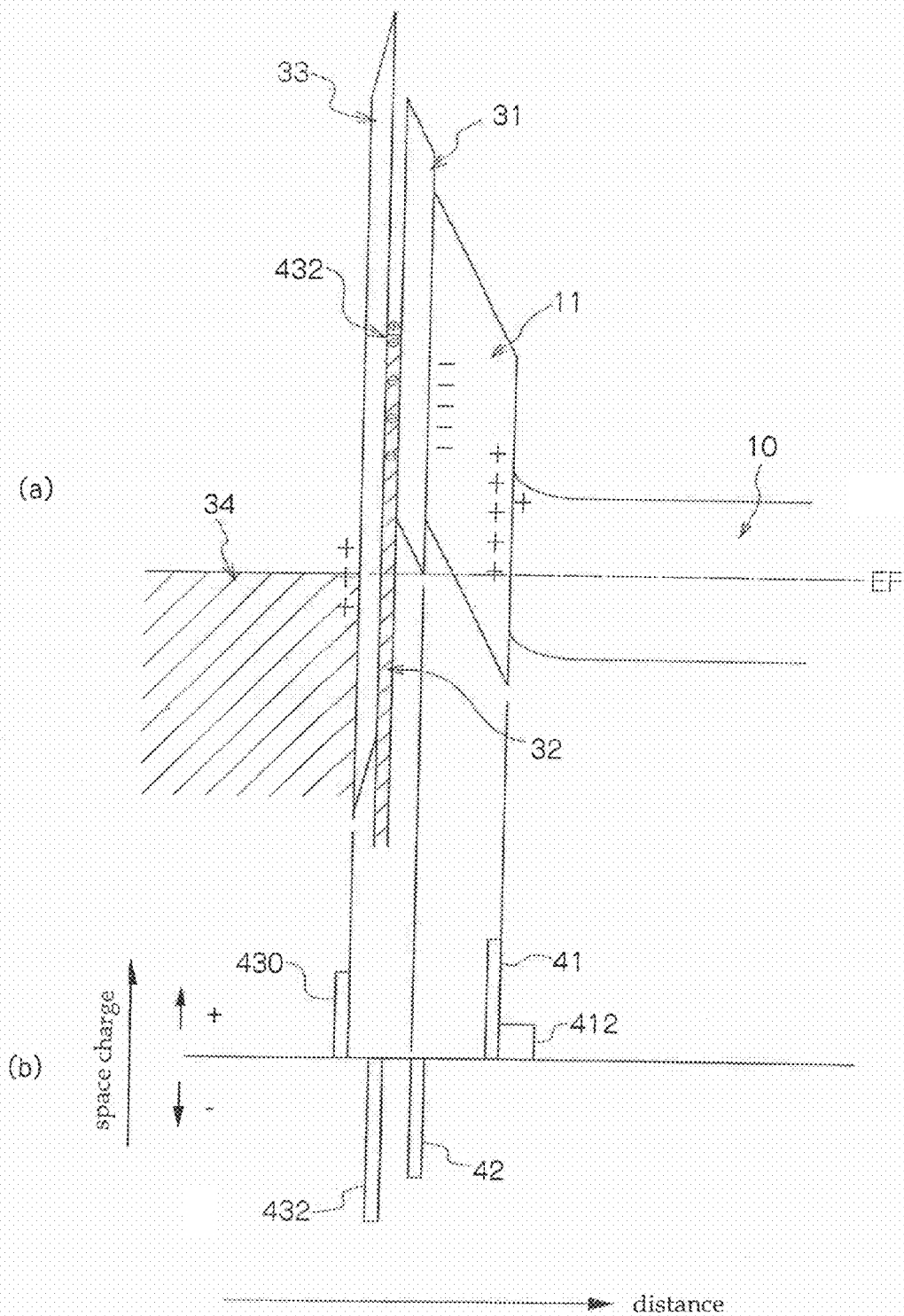
FIG. 3 (a) is an energy band diagram of the HFET according to the first embodiment, and FIG. 3 (b) is a space charge distribution diagram of the HFET.

On the contrary, the AlGaN/GaN HFET (1) according to the first embodiment, between the AlGaN layer (11) and the control gate electrode (34), as shown in the energy band diagram of FIG. 3 (a) and the space charge distribution diagram of FIG. 3 (b), comprises the floating gate layer (32) which is covered by the silicon nitride film layer (31) and the insulator layer (33) of silicon oxide, and a negative charge (432) is given to the floating gate layer (32) thereof. Therefore, all the electric lines of force from the positive charge (41) at the AlGaN layer (11) side are led toward the negative charge (432) of the floating gate layer (32) which is disposed between the AlGaN layer (11) and the control gate electrode (34). Hence, at the GaN layer (10) side, no negative charge is to be induced. For the case of the negative charge (432) sufficiently existing between the AlGaN layer (11) and the control gate electrode (34), and sufficiently compensating for the positive charge (41) at the AlGaN layer (11) side, a positive charge (412) becomes induced at the GaN layer (10) side as well. Moreover, the positive charge (412) is brought by ionized residual donors, or by positive holes induced in the GaN layer (10). Thus, the threshold voltage ($V_{th}$) of the AlGaN/GaN HFET (1) becomes able to be a required positive voltage.

Figure 4:
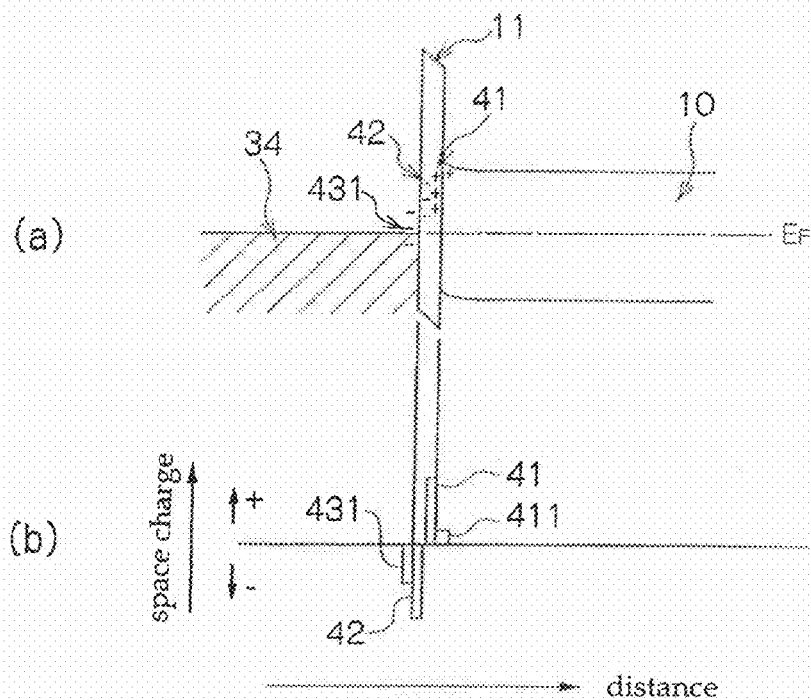
FIG. 4 (a) is an energy band diagram of the HFET according to the above mentioned document 1, and FIG. 4 (b) is a space charge distribution diagram of the HFET.

Furthermore, as the conventional technology such as described in the above mentioned document 1, for the case of reducing the positive charge (41) at the AlGaN layer (11) side of the AlGaN/GaN heterojunction interface by forming thinner AlGaN layer, as shown in the energy band diagram of FIG. 4 (a) and the space charge density diagram of FIG. 4 (b), by the spontaneous polarization and the piezoelectric effect, almost all of the electric lines of force out from the positive charge (41) appeared in the AlGaN layer (11) are terminated by the negative charge (42). Hence, the negative charge induced at the GaN layer (10) side is reduced. As a result, due to an effective difference between the work function of the control gate electrode (34) and that of the GaN layer (10), the negative charge (431) at the control gate electrode (34) side and the positive charge (411) at the GaN layer (10) side are a little left. And then at the channel, no two-dimensional electron gas is to be induced. Here, in the case of thinner limit of the AlGaN layer (11), that is to say, at the case of no AlGaN layer (11), the control gate electrode (34) and the GaN layer (10) becomes to have a Schottky junction. And then in the GaN layer (10), no electron is to be induced. Thus, the above mentioned phenomena are easily understood.

There are the following problems in the above mentioned structure. As shown in the energy band diagram of FIG. 5 (a) and the space charge distribution diagram of FIG. 5 (b), when a positive gate voltage $V_G$ (534) is applied to induce sufficient electrons (410) at the heterojunction interface between the AlGaN layer (11) and the GaN layer (10), the barrier height (51) of the AlGaN layer (11) becomes lower. Therefore, electrons cannot help but be flowed from the GaN layer (10) to the control gate electrode (34), That is to say, the gate forward current cannot help but b be flowed, and then sufficient channel electrons are not able to be trapped. Here, assumed that no AlGaN layer (11) as the limit case, it is easily understood that it cannot help but be flowed to the Schottky junction between the control gate electrode and the GaN layer. Therefore, sufficiently large amount of the drain current density is not able to be obtained.

Figure 5:
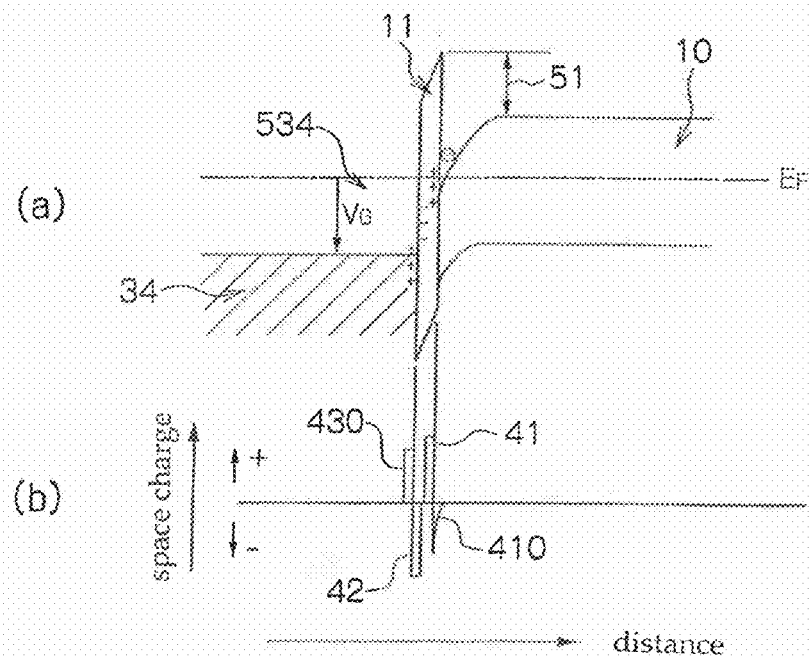
FIG. 5 (a) is an energy band diagram in the case of a positive gate voltage in the HFET according to the above mentioned document 1, and FIG. 5 (b) is a space charge distribution diagram of the HFET.
Figure 6:
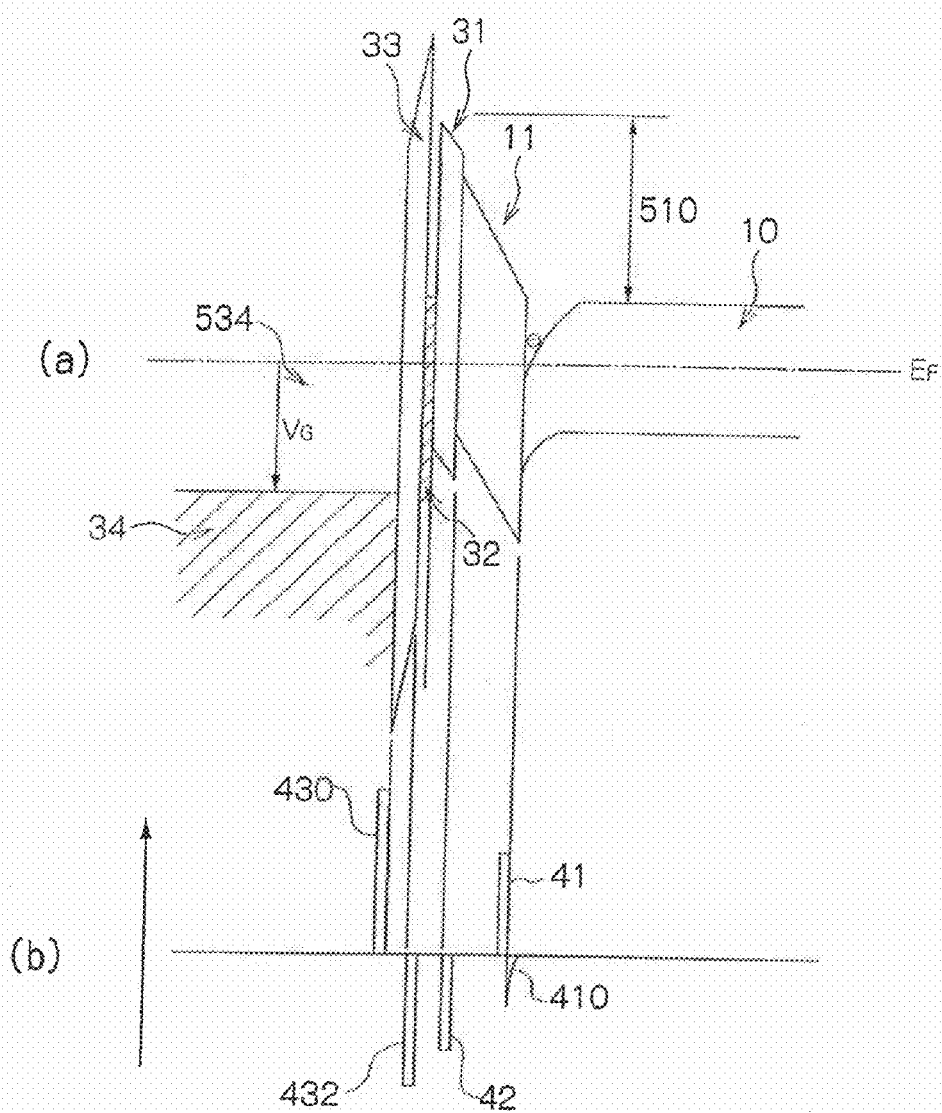
FIG. 6 (a) is an energy band diagram in the case of the positive gate voltage in the HFET according to the first embodiment, and FIG. 6 (b) is a space charge distribution diagram of the HFET.

On the contrary, the AlGaN/GaN HFET (1) according to the first embodiment, as shown in the energy band diagram of FIG. 6 (a) and the space charge distribution diagram of FIG. 6 (b), due to the negative charge (432) existing between the AlGaN layer (11) and the control gate electrode (34), a barrier (510) exists between the GaN layer (10) and the control gate electrode (34), which is sufficiently higher than the conventional barrier (51) shown in FIG. 5 (a). Hence, as the gate voltage $V_G$ (534) is sufficiently large positive value to induce sufficient two-dimensional electron gas at the channel, from the channel to the control gate electrode (34), no electron is flowed. Therefore, the gate current is suppressed, and then sufficiently large amount of the drain current density is able to be obtained.

Figure 7:
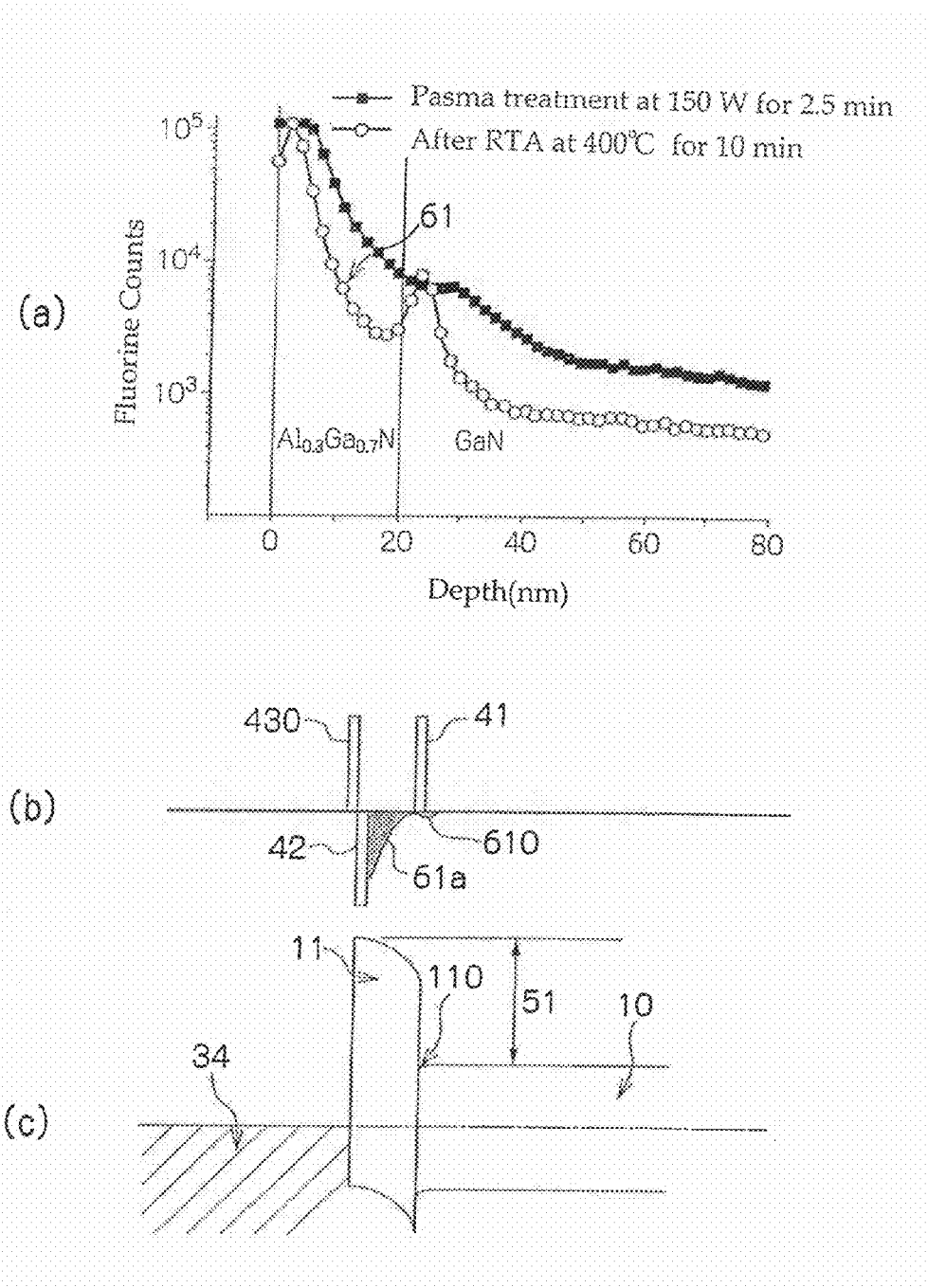
FIG. 7 (a) is a graph showing a distribution of $F^-$ ions in the HFET according to the above mentioned document 2, FIG. 7 (b) is a space charge distribution diagram estimated by the distribution of the F⁻ ions, and FIG. 7 (c) is an energy band diagram estimated by the space charge distribution.

Moreover, in the graph of FIG. 7 (a), regarding the conventional technology which is described in the above mentioned nonpatent document 2, by exposing the sample substrate in the $CF_4$ plasma, in the case of incorporating $F^-$ ions into the AlGaN layer, at around the AlGaN/GaN heterojunction interface, the distribution of $F^-$ ions are determined using a secondary ion mass spectroscopy (SIMS). Furthermore, FIG. 7 (b) shows the space charge distribution diagram assumed by the distribution result shown in FIG. 7 (a), and FIG. 7 (c) shows the energy band diagram which is estimated by the space charge distribution. As is clear from FIG. 7, in the conventional technology, close to the AlGaN/GaN heterojunction interface, a large amount of F– ions are incorporated. Hence, the energy band of the AlGaN layer (11) becomes convex upward (see FIG. 7 (b)). And then the barrier height (51) of the AlGaN layer (11) becomes lower. As a result, with the gate voltage positive, to induce sufficient electrons (410) at the interface between the AlGaN layer (11) and the GaN layer (10), from the GaN layer (10) to the control gate electrode (34), electrons become to be easily flowed.

Furthermore, in the conventional technology, after an annealing process of approximate 400° C. as a required process temperature, in the AlGaN layer (11), as shown with the curved line (61) in FIG. 7 (a), $F^-$ ions (61a) are distributed. Moreover, at an AlGaN/GaN heterojunction interface (110), $F^-$ ions (610) are accumulated (see FIG. 7 (b)). Moreover, due to the existence of the $F^-$ ions (610), the electrons at the channel are reduced, and the drain current density becomes lower. Furthermore, because $F^-$ ions work as a scattering center, a mobility of the channel electrons (two-dimensional electron gas) are reduced. Hence, comparing to an aim of a device in which the drain current is preferred to be flowed as much as possible for a unit gate width, an opposite result cannot help but be obtained.

On the contrary, in the AlGaN/GaN HFET (1) according to the first embodiment, the negative charge (432) to control the threshold voltage is formed between the AlGaN layer (11) and the control gate electrode (34) (see FIGS. 3 (a) and (b)). Hence, when a gate voltage is zero, no drain current is flowed. That is to say, a normally-off operation is able to be obtained, without giving any affect onto the channel. Moreover, by controlling the gate voltage to be positive, sufficient amount of the drain current is able to be flowed.

THE SECOND EMBODIMENT

Figure 8:
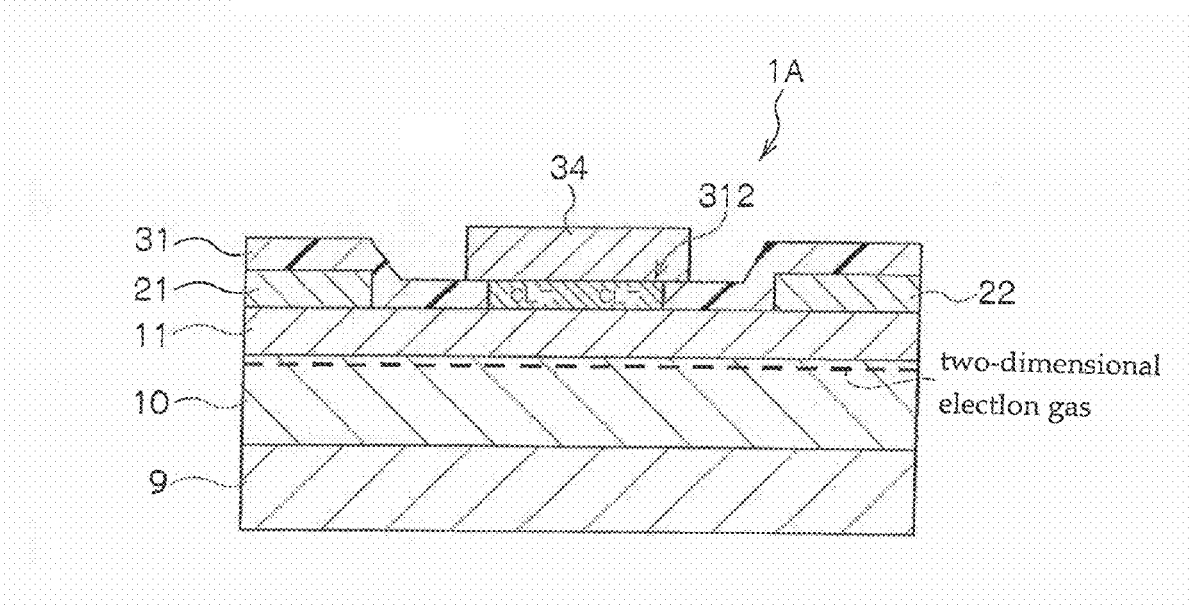
FIG. 8 is a cross sectional view showing a schematic structure according to the second embodiment of the present invention.

FIG. 8 shows a schematic structure of an AlGaN/GaN HFET (1A) according to the second embodiment. In the AlGaN/GaN HFET (1A), there is provided the silicon nitride ($SiN_x$) film (31) on an active area of the ordinary AlGaN (11)/GaN (10) HFET, using a catalytic chemical vapor deposition (Cat CVD) method, as similar to the first embodiment.

In a region directly under a gate (312) of the silicon nitride film layer (31), using such as ion implantation or the like, negative ions, such as $Cl^-$ or the like, are added. Moreover, in the AlGaN/GaN HFET (1A), different from the first embodiment as shown in FIG. 1, the control gate electrode (34) is formed directly on the silicon nitride film layer (31). Furthermore, by controlling the amount of the negative ions adding into the silicon nitride film layer (31), the threshold voltage of the AlGaN/GaN HFET (1A) is able to be freely controlled. Other portions in the structure are similar to the first embodiment as shown in FIG. 1.

According to the second embodiment including the above mentioned structures, adding to the functions and advantages obtained by the above mentioned first embodiment, the following functions and advantages are obtained.

By controlling the amount of the negative ions adding into the silicon nitride film layer (31), the threshold voltage of the AlGaN/GaN HFET (1A) is able to be freely controlled. And then as the threshold voltage is positive, that is to say, as normally-off type, the AlGaN/GaN HFET (1A) is able to be obtained.

In the AlGaN/GaN HFET (1A), a floating gate layer is not necessary to be provided.

Moreover, the control gate electrode (34) is able to be formed directly on the silicon nitride film layer (31).

Furthermore, the present invention is able to be embodied with further modifying, such as below described.

In the above mentioned each embodiment, as one example regarding nitride semiconductor heterojunction field effect transistors, AlGaN/GaN HFET is described, however, the present invention is not limited to the structure thereof. Regarding the present invention, heterojunction interfaces of nitride semiconductors, such as GaN, AlGaN, InGaN, and the like, are able to be used as channels. Moreover, at the control gate electrode (34) side, a first nitride semiconductor having a wide band gap, and at the sapphire substrate (9) side, a second nitride semiconductor having a narrower band gap than that of the first nitride semiconductor, are able to be formed respectively. And then it is possible to be widely applied to nitride semiconductors HFET thereby.

Specifically, according to the above mentioned each embodiment, instead of the GaN(10) in which the two-dimensional electron gas is formed, InGaN layer having narrower band gap may be used. Moreover, instead of the AlGaN layer (11), InAlGaN layer may be used as well. Moreover, the AlGaN layer (11) may be doped for supplying more amount of electrons. Furthermore, for the insulator layer (31) on the AlGaN layer (11), a silicon nitride film ($SiN_x$) is not always necessary to be used. And then with controlling an interface state density at the interface with the AlGaN layer (11), to be sufficiently smaller than (below $10^{11}$ $cm^{-2}$ for instance) the density of the two-dimensional electron gas (approximate $10^{13}$ $cm^{-2}$ ordinary), which should be induced at the heterointerface therebetween, $Al_2O_3$ film, $SiO_2$ film, and the like may be used.

According to the above mentioned each embodiment, the floating gate layer (32) is formed by a low resistance polysilicon, however, the floating gate layer (32) may be formed by a metal, such as molybdenum or the like.

According to the above mentioned each embodiment, the floating gate layer (32) may be structured using insulator layers formed by such as silicon nitride film ($SiN_x$), silicon dioxide film ($SiO_2$), and the like. Moreover, it may also be structured using the insulator layers in which a low resistance polysilicon or a metal, such as molybdenum or the like, is implanted. Furthermore, in the floating gate layer structured using the insulator layers or the metal, by trapping negative ions or electrons, the potential for the electrons in the AlGaN layer is able to be substantially high, and then the channel is able to be depleted. Hence, when the gate voltage is zero, no current is flowed through the channel. That is to say, the so-called normally-off type is able to be obtained.

According to the above mentioned first embodiment, on the floating gate layer (32), using the CVD method, the insulator layer (33) of silicon oxide is formed as the $SiO_2$ film, and then the floating gate layer (32) is insulated. However, by oxidizing the polysilicon in the upper part of the floating gate layer (32), the floating gate layer (32) may be insulated as well. According to the structure, the insulator layer (33) comprising the $SiO_2$ film is able to be omitted.

According to the above mentioned each embodiment, instead of the sapphire substrate (9), other substrates, such as SiC, GaN, Si, and the like, may be used.

According to the above mentioned each embodiment, between the sapphire substrate (9) and the GaN layer (10), a buffer layer using such as AlN or the like may be formed. And then it is structured for the nitride semiconductor heterojunction field effect transistor. Thus, the present invention is possible to be applied thereinbefore.

The present invention is not limited to the above described embodiments and various and modifications may be possible without departing from the scope of the present invention.

This application is based on the Japanese Patent application No. 2006-311782 filed on Nov. 7, 2006, entire content of which is expressly incorporated by reference herein.

What is claimed is:

1. A nitride semiconductor heterojunction field effect transistor comprising:
   a substrate;
   a first nitride semiconductor layer formed on the substrate;
   a second nitride semiconductor layer formed on the first nitride layer, which forms a heterojunction with the first nitride semiconductor layer, and forms a channel at an interface of the heterojunction;
   a source electrode, a drain electrode and a control gate electrode; and
   a dielectric layer, which is formed between the control gate electrode and the second nitride semiconductor layer, and which is negatively charged,
   wherein the dielectric layer comprises a conductive layer which is negatively charged by electrons, and the conductive layer is covered by an insulator layer.

2. The nitride semiconductor heterojunction field effect transistor according to claim 1,
   wherein the dielectric layer comprises a polysilicon.

3. The nitride semiconductor heterojunction field effect transistor according to claim 1,
   wherein the dielectric layer comprises a high-melting metal.

4. The nitride semiconductor heterojunction field effect transistor according to claim 1,
   wherein the insulator layer covering the dielectric layer comprises a first insulator layer and a second insulator layer; the first insulator layer contacts with the second nitride semiconductor layer, and the second insulator layer is disposed between the dielectric layer and the control gate electrode.

5. The nitride semiconductor heterojunction field effect transistor according to claim 4,
   wherein the first insulator layer contacting with the second nitride semiconductor layer is formed of silicon nitrides.

6. The nitride semiconductor heterojunction field effect transistor according to claim 1,
   wherein the dielectric layer comprises an insulator layer including negative ions.

7. The nitride semiconductor heterojunction field effect transistor according to claim 6,
   wherein the negative ions are chlorine ions ($Cl^-$).

8. The nitride semiconductor heterojunction field effect transistor of claim 6,
   wherein the insulator layer including the negative ions is formed of silicon nitrides.

* * * * *